(12) United States Patent
Queveau et al.

(10) Patent No.: US 7,237,822 B2
(45) Date of Patent: Jul. 3, 2007

(54) REAR BOOT HOOD WITH DOUBLE SWIVEL LOCK FOR A CONVERTIBLE VEHICLE WITH FOLD-A-WAY ROOF

(75) Inventors: Gerard Queveau, Le Pin (FR); Paul Queveau, Montravers (FR); Jean-Marc Guillez, Cirieres (FR)

(73) Assignee: Societe Europeenne des Brevets Automobiles (FR)

( * ) Notice: Subject to any disclaimer, the term of this patent is extended or adjusted under 35 U.S.C. 154(b) by 0 days.

(21) Appl. No.: 10/522,060

(22) PCT Filed: Jun. 30, 2004

(86) PCT No.: PCT/FR2004/001687

§ 371 (c)(1),
(2), (4) Date: Jan. 18, 2006

(87) PCT Pub. No.: WO2005/012018

PCT Pub. Date: Feb. 10, 2005

(65) Prior Publication Data

US 2006/0131920 A1 Jun. 22, 2006

(30) Foreign Application Priority Data

Jul. 2, 2003 (FR) .................................. 03 08052

(51) Int. Cl.
*B60J 7/20* (2006.01)
*B62D 25/10* (2006.01)
(52) U.S. Cl. ............... 296/107.08; 296/76; 296/136.03
(58) Field of Classification Search .......... 296/107.08, 296/76, 136.03, 136.05, 136.06, 136.09
See application file for complete search history.

(56) References Cited

U.S. PATENT DOCUMENTS

| | | | |
|---|---|---|---|
| 6,164,713 A * | 12/2000 | Graf et al. ............. | 296/107.08 |
| 6,250,707 B1 | 6/2001 | Dintner et al. | |
| 6,464,282 B2 * | 10/2002 | Ellermann et al. ............ | 296/70 |
| 6,604,775 B2 * | 8/2003 | Obendiek .................. | 296/108 |
| 6,811,206 B2 * | 11/2004 | Wagner .................. | 296/136.05 |
| 6,824,194 B2 * | 11/2004 | Weissmueller et al. | 296/136.05 |
| 6,866,327 B2 * | 3/2005 | Willard .................. | 296/136.06 |
| 6,948,762 B2 * | 9/2005 | Antreich ................ | 296/136.06 |
| 7,004,529 B2 * | 2/2006 | Guillez et al. ................ | 296/76 |
| 7,032,947 B2 * | 4/2006 | Queveau et al. ......... | 296/24.44 |
| 7,032,952 B2 * | 4/2006 | Dilluvio ................ | 296/107.08 |
| 7,093,885 B2 * | 8/2006 | Guillez et al. ......... | 296/107.08 |
| 2006/0131920 A1* | 6/2006 | Queveau et al. ....... | 296/107.08 |

FOREIGN PATENT DOCUMENTS

DE 44 11 694 10/1995
EP 1 084 886 3/2001

* cited by examiner

*Primary Examiner*—D. Glenn Dayoan
*Assistant Examiner*—Greg Blankenship
(74) *Attorney, Agent, or Firm*—Fish & Richardson P.C.; Richard P. Gilly

(57) ABSTRACT

Each of the sets of pivots (5) comprise a base (9) fixed to the bodyshell (10) of the vehicle, a body (11) linked to the hood (4) of the rear boot by a hinge (12) and means for locking the body (11) in relation to the base. For a lock in the closed position of the hood, a hook (16) of the front and rear sets of pivots (5 and 7) engages, in a co-ordinated manner, the first and second stubs (17 and 21), whereas, for an opening of the hood swiveled towards the rear, during unfolding or folding away of the roof into the boot, the hooks (16) of the front and rear sets of pivots operates so as to respectively and solely engage the second stubs (17) of the rear set of pivots (7) and release, in a co-ordinated manner, the second and third stubs of the front set of pivots (5), and inversely for an opening swiveled towards the front of the hood, to access a luggage loading zone in the boot.

20 Claims, 4 Drawing Sheets

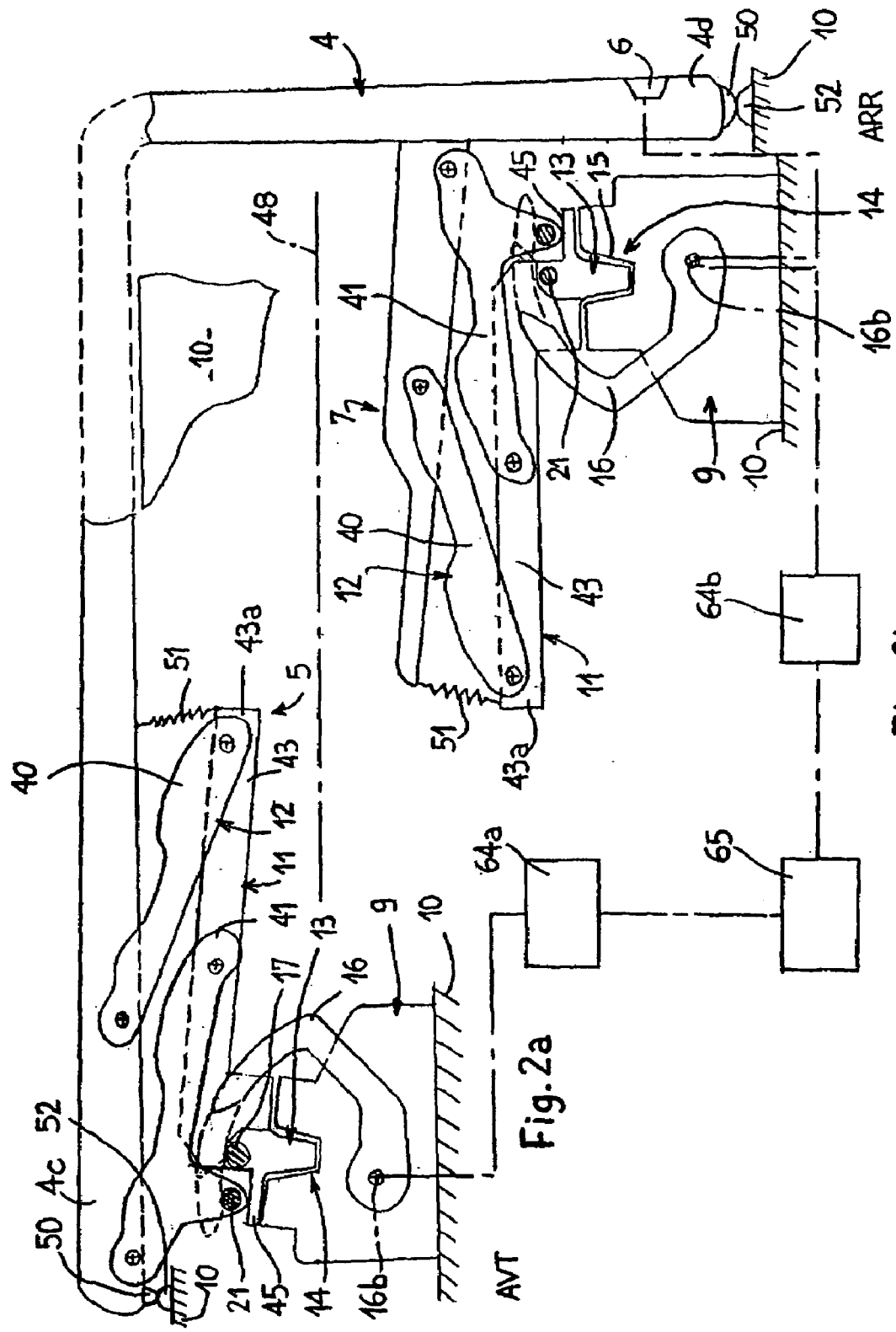

REAR BOOT HOOD WITH DOUBLE SWIVEL LOCK FOR A CONVERTIBLE VEHICLE WITH FOLD-A-WAY ROOF

TECHNICAL FIELD

The invention relates to the swiveling of a rear boot hood for a convertible vehicle with a roof folding into this boot. Sets of front and rear pivots are fitted.

The invention therefore relates to the device defined for this purpose, applied to the corresponding vehicle, on its rear boot.

BACKGROUND

We are aware of, according to FR-B-2 777 241, a solution where each set of pivots is a lock whose function is either to lock or articulate the hood so that it can either open from the front to the rear or from the rear to the front.

We are also aware of U.S. Pat. No. 6,250,707 and EP-A-1084886.

This solution applies to a convertible vehicle comprising a rear boot, a hood for this boot and a roof folding into the boot, a front set of pivots capable of swiveling the hood from the rear to the front and a rear set of pivots capable of swiveling the hood from the front to the rear, each group of pivots comprising a base fixed to the bodyshell of the vehicle, a body which is linked to the hood via means creating a hinge and which comprises a first assembly element capable of engaging in a detachable manner into a second assembly element linked to the corresponding base, and means for locking/unlocking comprising a first engaging means linked to the base in a movable manner and capable of engaging in a free manner a second complementary engaging means linked to the first assembly element so as to, in a locked position, lock the body in relation to said base. The first assembly element of each set of pivots comprises a third complementary engaging means capable of being engaged in a free manner with the first engaging means, which is designed so as to be able to have several positions of which one authorized rotation position of the hood in which, at the place of one among the front and rear sets of pivots, this first engaging means maintains the second complementary engaging means engaged with it whilst releasing the third complementary engaging means from its engagement, thus ensuring the hinge effect during the swivel opening of the hood.

Irrespective of how effective it is, this solution can be improved so as to be able to swivel the hood with greater precision, an even more efficient mechanism for articulating and a possibility of compensation for play between the concerned body and base.

SUMMARY

This being a purpose of the invention.

For this reason, it is proposed that at the place of the other among said front and rear sets of pivots, the first engaging means releases both the second and third complementary engaging means from being engaged with it, so that the hood can then be distanced at this place from the body by swiveling around said created hinge, this first engaging means (16) successively meeting and leaning against the second then third complementary engaging means during the locking of this body in relation to the base.

A selective double locking is thus obtained.

Moreover to further improve the compensation for play between the body and the concerned base, we furthermore advise:

that means creating the hinge of (each) set(s) of pivots comprises at least one arm articulated on one side in relation to the hood and on the other end in relation to a leg belonging to the body, that each second complementary engaging element consists in a backup support integral with the concerned leg, that each third complementary engaging element consists in a backup support integral with said arm;

and that the first corresponding engaging element successively meets and leans against these second then third complementary engaging elements during the locking of the body in relation to the base, the arm fitted with said third complementary engaging element then itself leaning against a part of the leg in the direction of the engagement of the concerned assembly element with the other one, during locking.

Thus, we positively guide and drive the body and therefore the hood into its locked position and restrict the play between this hood and the body (therefore the chassis).

Such a structure is well adapted to take into account all the fits and clearances as much due to the mounting requirements of the hood as to the distortions of the latter during its different swivel movements, whilst ensuring its positive guiding into its locked position, with a double locking, which is an efficiency guarantee.

DESCRIPTION OF THE DRAWINGS

Other features and advantages of the invention, even a "constant pressure" lock, will come out from the detailed description below which refers to the annexed drawings, given by way of non-restrictive examples, and in which:

FIGS. 2*a* and 2*b* are expanded views with detailed sections A and B from FIG. 1, respectively representing a unit of the front set of pivots and a unit of the rear set of pivots of a rear boot hood according to an embodiment of the invention, said hood being in its closed position;

Figure 5:
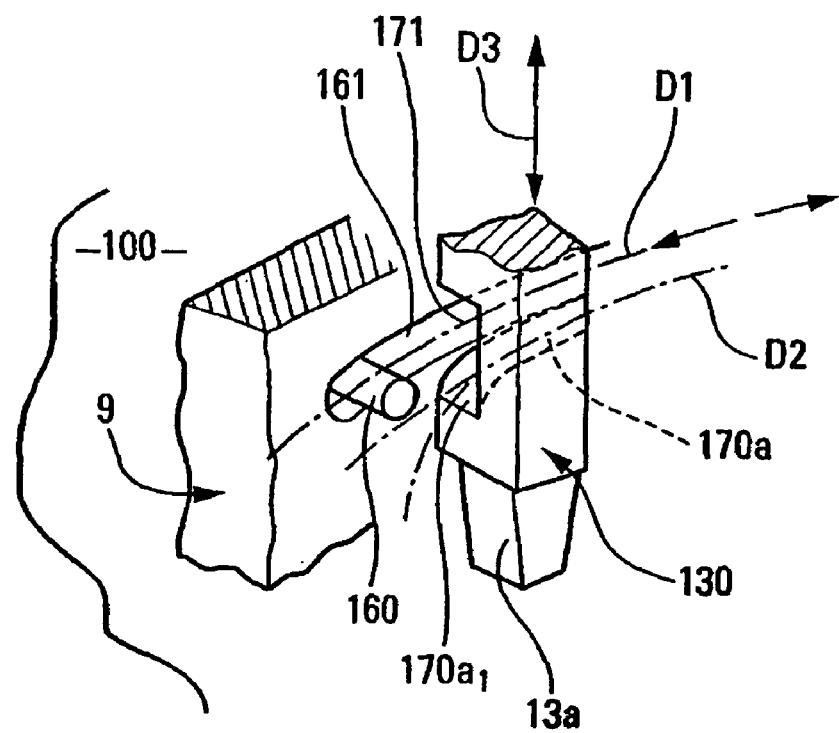
Figure 6:
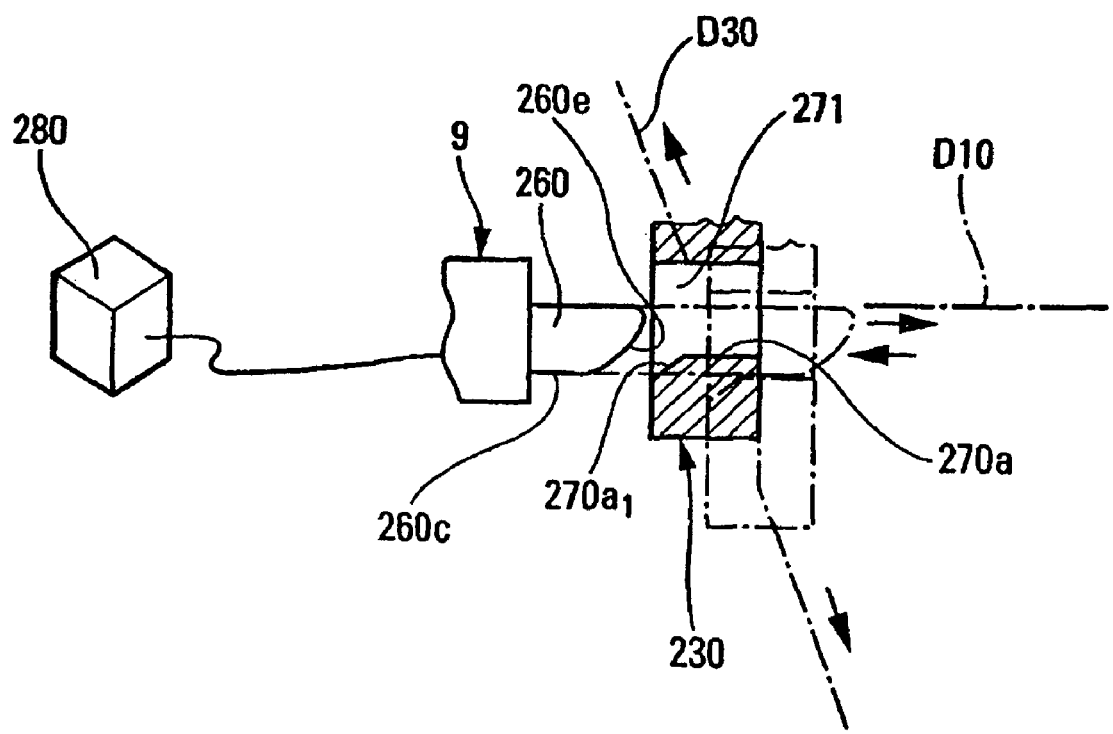

and,

FIGS. 5 and 6 diagrammatically illustrate two alternative locking system;

DETAILED DESCRIPTION

Figure 1:
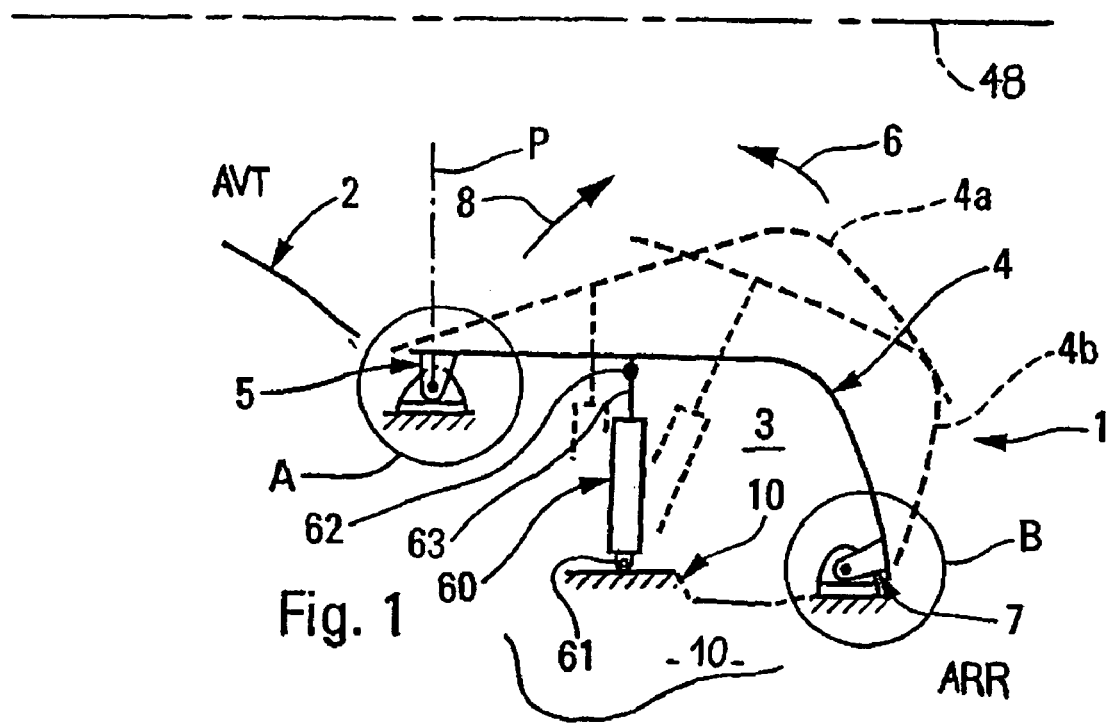
FIG. 1 is a partial diagrammatic view, of longitudinal section, of a convertible vehicle with a fold-away roof comprising a rear boot hood according to the prior art.
Figure 4:
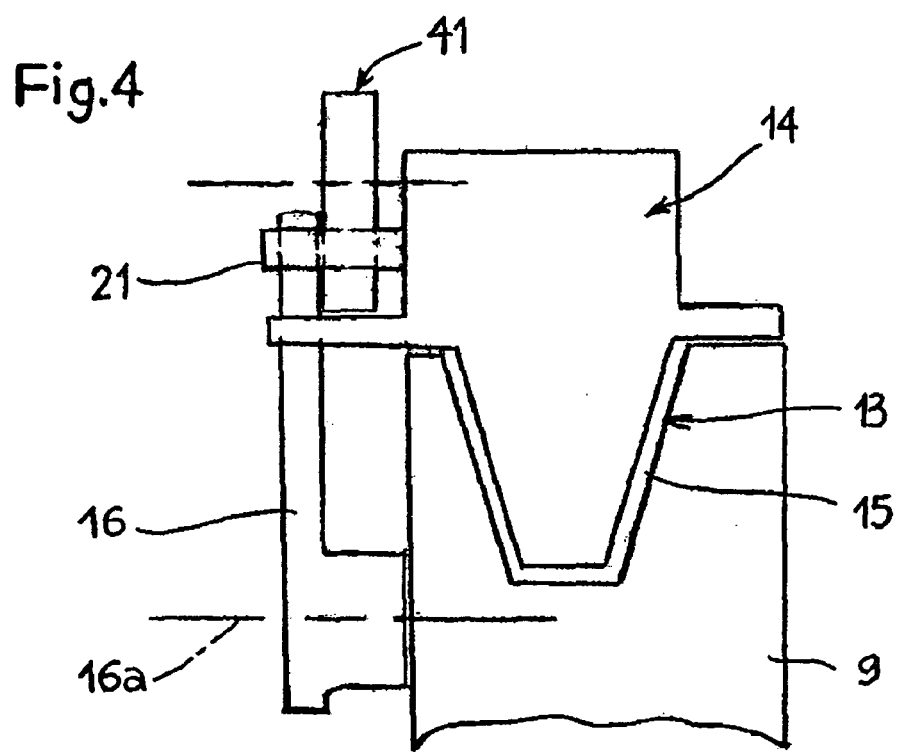
FIG. 4 is a view according to section IV-IV in FIG. 3, the hook being in its locked position.

FIG. 1 diagrammatically represents a convertible vehicle, reference 1, whose roof 2 is collapsible into the inside of the rear boot 3 of the vehicle 1. Such a collapsible roof 2 is known of.

The hood 4 of the rear boot 3 preferably comprises near its front edge (AVT) a front set of pivots 5 including two identical units capable of swiveling this hood from the rear to the front, in the direction of the arrow 6 in FIG. 1, until it reaches the position 4*a* in the drawing, to provide easy access to the rear boot, for example to place luggage (not represented).

The hood 4 swivels in a standard manner through the operating of at least one actuator 60 (normally two actuators 60 placed on either side of the rear boot 3).

Each actuator is articulated at its base 61 on the bodyshell 10 of the vehicle, and the end 62 of its rod 63 is, directly or indirectly, articulated on the hood 4.

The hood 4, in principle, also comprises, towards its rear edge (ARR), a rear set of pivots 7 with two units capable of swiveling the hood 4 from the front to the rear, in the direction of the arrow 8, until it reaches the position 4b, to allow the passage and the storing of the collapsed roof 2 inside the rear boot 3.

As represented in detail in FIGS. 2a and 2b each set or unit of pivots 5 and 7 comprises a base 9 fixed to the bodyshell 10 of the vehicle and which comprises a first assembly element 13 capable of engaging, in a detachable manner, a second assembly element 14 linked to a body 11 attached to the hood 4 through a structure creating a hinge 12. Preferably the elements 13 and 14 are of complementary shape.

As notably represented in FIGS. 2a to 4, the first assembly element 13 is a male element substantially wedge shaped capable of engaging into a substantially wedge shaped cavity 15 of the second female element 14. The surface 13a of the projecting element 13 guides the end of the swiveling of the hood, by accompanying the element along the walls 15b of the cavity 15.

The wedge shape of the first and second assembly elements ensures accurate guiding of the end of the swiveling movement of the hood 4 to its closed and locked position, these wedge shapes extending along a vertical plane P transversal in relation to the hood.

Each set of pivots 5 and 7 also comprises means for locking/unlocking comprising a first engaging means 16 linked in a movable manner to the corresponding base 9 and capable of engaging in a free manner a second complementary engaging means 17 linked to the first assembly element 13 so as to, in a locked position, lock the body 11 in relation to the corresponding base 9.

Preferably, the means for locking each comprise, as the first engaging means 16, a hook mounted in a swivel manner onto the base 9 (axle 16b) and capable of gripping with the second complementary engaging means 17, which advantageously defines a backup support in the shape of a stub. The hook leans against this backup and guides the end of the swiveling movement of the hood until it reaches the corresponding locked position.

In this embodiment, the free end 16a of the hook 16 is skewed and the upper support surface of the stub 17 is rounded, which favours the supporting effect and the restricting of play on the plane of the joint 19 between the parts 13 and 14.

Both to favour this compensation for play and to obtain the aforementioned double locking effect, the first assembly element 13 of each front and rear set of pivots further comprises, according to the invention, a third complementary engaging element 21 capable of being engaged in a free manner by the means 16, so that:

for a lock in the closed position of the hood, the first movable engaging elements 16 of the front and rear sets of pivots engage, in a co-ordinated manner, the corresponding second (17) and third (21) complementary engaging elements;

whereas, for an opening swiveled towards the rear of the hood 4, during folding away or unfolding of the roof 2 in the (or out of the) boot, each first engaging element 16 of the rear and front sets of pivots operates so as to respectively and solely engage the corresponding second complementary engaging means 17 of the rear set of pivots 7 and release, in a co-ordinated manner, the second and third complementary engaging elements of the front set of pivots 5; and inversely for an opening swiveled towards the front of the hood.

In the illustrated solution, a full locking of the hood 4 or an authorized opening of the latter, towards the front or the rear, is thus obtained, depending on the engagement (rotation) angle of the hooks 16.

Preferably, each third complementary engaging element 21 consists, just as the element 17, in a backup support. And it is advantageously placed so that the corresponding hook 16 successively meets and leans against the second then the third concerned complementary engaging element, during the locked closing of the hood.

In this regard, we note that, in the illustrated solution, both the backups 17 and 21 each have the form of a stub projecting towards the hook 16, transversal to the engagement direction 18, and the hook 16 is shaped and placed on the base 9 so that its free end 16a leans against the stubs when they meet, for two reasons, on one hand, solicit the first assembly element 13 in the direction of the arrow 18 towards its locked position in the corresponding base 9, and on the other hand, lock it there.

Just as the upper support surface of the stubs 17, that of the stubs 21 is in fact here rounded, for the same reasons.

In addition, the hook 16 is advantageously shaped so as to resist any attempt to open the hood 4, in that a vertically upward effort being applied to the first assembly element 13 does not exercise any force on the hook tempting to make it swivel towards its unlocked position (solid line in FIGS. 2a and 2b, the locked position of the end of the hook being represented by a dotted line).

In like manner, the (or each) hook 16 is shaped and arranged on the base 9, in relation to the elements 17 and 21, so that it is capable of gripping with them in a position of the element 13 as far away as possible from its locked position. The first engaging means 16 is thus a motor element commanding the end of the swivel movement of the hood 4, in co-operation with the actuators 60.

The hood 4 comprises means 64a and 64b (FIGS. 2a and 2b) to make each hook 16 swivel in one or other direction around its swivel axle (here horizontal 16b) to lock or release the first assembly element 13. These means for swiveling can be any known means, and can comprise a drive motor, for example, a worm engaging with teeth integral with the hook. An embedded control unit 65 with a microprocessor and/or sensors commands the motor in an appropriate manner, in particular to co-ordinate the movements of the means 16 during the locking or opening of the hood. It is noted that the vehicle preferably further comprises means, such as a lock 67 fixed to the boot and linked to at least the rear set of pivots 7 (engaging means 16) so as to be able to manually unlock it from the outside of the vehicle.

In the embodiment represented in FIGS. 2a and 2b, the means creating the hinge 12 of each set of pivots 5 and 7 comprises two substantially parallel arms 40 and 41, articulated (directly or indirectly) at an end on the inner part of the hood 4 and at the opposite end on a leg (or second arm) 43 integral with the corresponding first assembly element 13.

Advantageously, when one such leg and at least one such arm 40 or 41 exist, they respectively bear a second and third means 17 and 21. According to the case, the arm 41 fitted with the stub 21 does or does not lean against, in 44, a part 45 of the leg 43. In particular, malleable seals 50 and 52, preferably respectively fitted on the internal rim of the hood 4 and of the part facing the bodyshell 10 (FIGS. 2a and 2b), can be placed and designed, in connection with the locking/unlocking system 5 and 7 so that once the lock 16 (even 160, 260 . . . ) is held by the complementary engaging means 17 (respectively 170a and 270a), the seals are already in their normal compressed state and the play 19 (FIG. 3) has already been taken up. It is then unnecessary for the lock to lean against the third complementary means 21 until it compensates for the play in 44 opposite the rim 45; the arm 41 may not necessarily lean against the rim 45.

Figure 3:
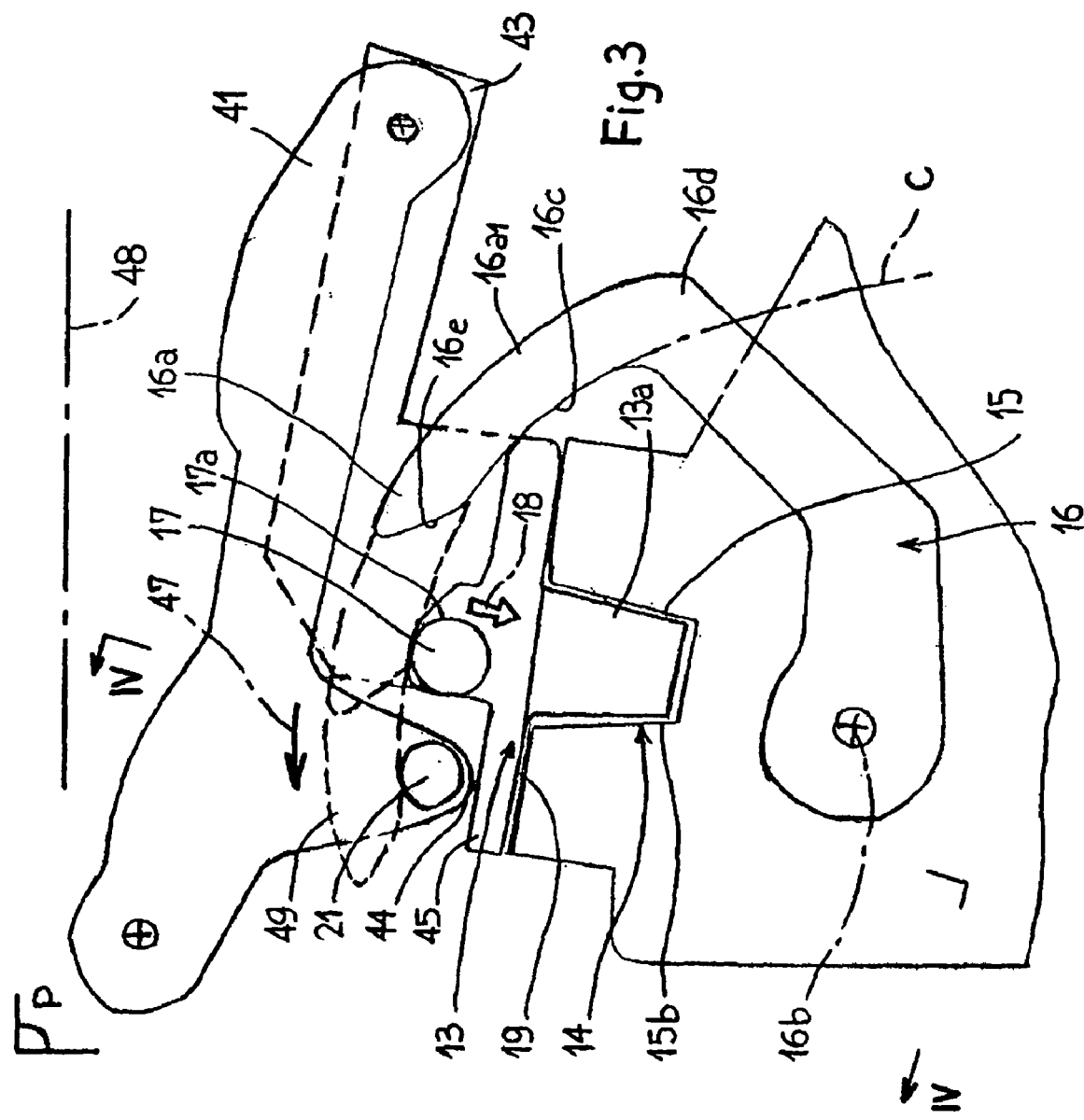
FIG. 3 is an expanded view of an essential part of the unit of the front set of pivots in FIG. 2.

The zones 44 and 45 are preferably located past the stub 17 (in relation to the engagement direction 47 of the means 16 indicated in FIG. 3), in the closed position of the hood, so that the locking of the hood induced by the action of 16 and 17 is efficiently completed via the elastic effect of the seals and/or the pressure in 44 which secures the locking and compensates for the play in 19 (bond line of 13 and 14).

The zone of controlled play 44 is in addition located at an end of an extension 49 of the arm directed towards a shoulder 45 of the leg 43 in the shape of a flat extension. The zones and means 21, 44 and 45 are in the closed position of the hood and along the longitudinal axis 48 of the vehicle, located nearer the axial end nearest to this hood than means 21 is and the zone of co-operation between the elements 13 and 14.

In the illustrations, where double arms are envisaged, each leg 43 has, substantially parallel to the axis 48 and in the closed position of the hood, an elongation, the arm 41, fitted with the third engaging means 21, articulating towards an axial end (4c or 4d) of the hood, the other arm 40 being articulated towards the end 43a of the concerned leg the furthest from the corresponding axial end of the hood, along the axis 48.

Moreover, a retracting spring 51 fitted to each set of pivots 5 and 7 and placed between the hood 4 and the corresponding body 11 (here the leg 43) returns the hood 4 in its closed position in FIGS. 2a and 2b.

We also note that at the front, the hooks are preferably open towards the front and at the rear, open towards the rear.

Even though we can disassociate the preceding from what follows, taking into account the raised problems, we moreover note with interest that in FIG. 3 the concave shape of the engaging surface 16c of the hook 16 located towards the free end part 16a1 of the latter (between the end 16a and its bend 16d) and by which the hook engages the second and third complementary engaging means 17 and 21. Indeed, this surface 16c advantageously extends according to a circle C whose centre is located on the swivel axis 16b of the hook. Thus, as illustrated in this figure, the hook can ensure a substantially constant pressure throughout its swivel stroke on the complementary engaging means 21, and most of all 17, located before it in the locking stroke of the hook, once past its end bevel 16e which allows, in connection with the rounded contact surfaces 17 and 21 (such as the cylindrical surface 17a), to progressively initiate tightening and avoid any jamming.

With the movement of the surface 16c along the circle C, the wear and tear or distortion is notably limited on the hook head 16a1 and/or elements 17 and 21, and therefore the risks of play between them, which would affect the locking.

In FIG. 5, the hook is replaced by a slug 160 with a curved support surface 160c projecting through a slot 161 of a base 9 linked to the structure 100 of the vehicle. The slug slides in the slot in order to co-operate with a curved support surface 170a made in a hole 171 of the first assembly element 130 (which can, in addition, be identical to means 13, notably with the wedge 15a).

The respective directions D1 and D2 of locking and extension of the slug and of the surface 170a are parallel and have the same curve, only the start 170a1 of the surface 170a is steeper so that the slug which firstly meets this start, during the final swiveling of the hood, displaces the element 130 in the engagement direction D3 (substantially perpendicular to D1), before applying the desired constant pressure, the element 130 remaining motionless along D3.

In FIG. 6, the movable element of the lock, linked to the base 9, is a hood locking bolt 260 with an active surface 260c terminated by a chamfer 260e and driven by a straight line movement along D10, transversal to the engagement direction D30 which extends at an angle. During locking, the hood locking bolt, put into motion by the means of drive 280 (electric motor), firstly meets, on the inside of the opening 271 where it can fit into, the bevel 270a1 of the surface 270a of the first assembly element 230 linked to the hood. The hood locking bolt then pushes the element 230 downwards, along D30 (dot and dash line), until it reaches the straight line surface 270a parallel to the surface 260c.

Of course, the invention is not restricted to the embodiment that has just been disclosed, and modifications can be made to it without diverging from the scope of the invention.

We can thus replace the wedge shapes of the assembly elements 13 and 14 by tapered shapes or pyramid frustum shapes ensuring a guiding both in the longitudinal plane and in the transversal plane.

We can also envisage the base 9, the hook 16 and its motor on the hood 4 and the body 11 on the bodyshell 10 of the vehicle.

The invention claimed is:

1. A convertible vehicle having a front and a rear, and comprising a bodyshell locally defining a ear boot which is provided with a hood, a roof collapsible into said rear boot, and, first pivot means and second pivot means which are adapted for allowing said hood to swivel with respect to the bodyshell, from said rear towards said front and from said front towards said rear, respectively, each of said first and second pivot means comprising:

a base (9) fixed to said bodyshell of the vehicle,
a body (11) attached to the hood through hinge means, said body comprising a first assembly element (13) adapted for reversibly engaging a second assembly element (14), for guiding the hood up to a locked position in which said hood is locked on said bodyshell,
reversible locking means cans comprising a first engaging means (16,160,260) movably connected to the base along a displacement track of a reversible locking direction (D1,D10) and adapted for reversibly en gaging a second complementary engaging means (17,170a, 270a) connected to the first assembly element so as to lock the body to said base, in said locked position, the first engaging means and the second complementary engaging means having a first contact surface and a second contact surface, respectively,
wherein the first assembly element of each of said first and second pivot means comprises a third complementary engaging means (21) adapted to be reversibly engaged by the corresponding first engaging means, and wherein, at the location of one of said first and second pivot means, the corresponding first engaging means engages the corresponding second complementary engaging means, whilst releasing the corresponding third complementary engaging means from engagement therewith, thus creating a hinge effect during swiveling of the hood, while at location of the other of said first and second pivot means the corresponding first engaging means releases both the corresponding second and third complementary engaging means from being engaged therewith, so that the hood can be there distanced from the bodyshell, by swiveling around said created hinge, and wherein control means are provided to bring the second and third complementary engaging means across the displacement track of the corresponding first engaging means, along an engagement direction transversal to said reversible locking direction.

2. The vehicle set forth in claim 1, in which said hinge means of said first and second pivot means comprises at least one arm articulated on one side in relation to the hood and on another side in relation to the body, wherein the corresponding third complementary engaging means is located on said at least one arm.

3. The convertible vehicle of claim 1, wherein, while locking the body and the base together, the first engaging means of the corresponding one of said first and second pivot means engages and successively presses on the corresponding second and then third complementary engaging means.

4. The convertible vehicle of claim 1, wherein the first assembly element reversibly engages the corresponding second assembly element by means of first and second runner surfaces respectively fitted to the first assembly element and to the second assembly element, said first and second runner surfaces being engaged together only at a final portion of said swiveling of the hood relative to the bodyshell, for guiding the hood along said final portion, up to said locked position of the hood on said bodyshell.

5. The convertible vehicle of claim 1, wherein:
the third complementary engaging means has a third contact surface for engagement with said first contact surface, and
at least one of the first, second and third contact surfaces has an initial pressure zone where, during locking, the contact is initiated between said first contact surface and the second and third contact surfaces, the initial pressure zone being angulated relative to said reversible locking direction of the corresponding first engaging means and being interposed on the displacement track of said first engaging means, so that said first engaging means displaces the corresponding second and third complementary engaging means along said engagement direction, by applying a pressure that initially increases, as the contact between said first contact surface and at least one of said second and third contact surfaces develops, before said pressure becomes and remains substantially constant, while said second and third complementary engaging means substantially stop moving along said engagement direction.

6. The convertible vehicle of claim 1, wherein said first contact surface is curved along said reversible locking direction.

7. The vehicle set forth in claim 1, wherein the first engaging means is swivelly mounted relative to the corresponding base, around a swivel axis.

8. The vehicle set forth in claim 1, wherein said first contact surface of the first engaging means extends at least essentially along a circle having a centre located on said swivel axis.

9. The vehicle set forth in claim 1, wherein:
each first engaging means comprises a hook,
the first contact surface of said first engaging means is curved along said reversible locking direction, and
at least one of said corresponding second and third contact surfaces is also curved.

10. The vehicle set forth in claim 1, wherein the first runner surface is located on a substantially wedge-shaped male element of the first assembly element adapted to engage a substantially wedge-shaped female cavity element of the second assembly element.

11. The vehicle set forth in claim 1, wherein:
the first engaging means is swively mounted relative to the corresponding base, and
at least some of the second and first contact surfaces respectively belong to a backup support of the first assembly element and to the first engaging means, said first engaging means being adapted for gripping with said backup support so as to:
lean against it, during locking, while the first assembly element has not yet reached its locked position, along said engagement direction, and
accompany a final portion of the swivel movement of said first assembly element, and thus that of the hood, down to said locked position.

12. The vehicle set forth in claim 1, wherein the respective first, second and third contact surfaces are so designed that while said first contact surface is engaging said second and third contact surfaces, along at least a major portion of the movement of the first engaging means on said displacement track, said first engaging means is applying a essentially constant pressure on the corresponding second and third complementary engaging means.

13. The vehicle set forth in claim 1, wherein:
the first and second pivot means comprise respectively a front set of pivots adapted to swivel the hood from the rear to the front and a rear set of pivots, located nearer the rear of the boot and the hood than the front set of pivots and adapted to swivel said hood from the front towards the rear
the first engaging means comprise hooks,
the front set of pivots is located at the front of the boot and the hood and the rear set of pivots is located at the rear of the boot and the hood;
and, at the front, the hooks are open towards t e front and, at the rear, the hooks are open towards the rear.

14. A convertible vehicle having a front and a rear, and comprising a bodyshell locally defining a rear boot which is provided with a hood, a roof collapsible into said rear boot, and, first pivot means and second pivot means which are adapted for allowing said hood to swivel with respect to the bodyshell, from said rear towards said front and from said front towards said rear, respectively, each of said first and second pivot means comprising:
base (9) fixed to said hood of the vehicle,
a body (11) attached to the bodyshell through hinge means, one of said base and said body comprising a first assembly element (13) adapted for reversibly engaging a second assembly element (14), for guiding the hood up to a locked position in which said hood is locked on said bodyshell,
reversible locking, means comprising a first engaging means (16,160,260) movably connected to one of the body and the base along a displacement track of reversible locking direction (D1,D10) and adapted for reversibly engaging a second complementary engaging means (17,170a,270a) connected to the first assembly element so as to lock the base to said body, in said locked position, the first engaging means and the second complementary engaging means having a first contact surface and a second contact surface, respectively, wherein the first assembly element of each of said first and second pivot means comprises a third complementary engaging means (21) adapted to be reversibly engaged by the corresponding first engaging means, and wherein, at the location of one of said first and second pivot means, the corresponding first engaging means engages the corresponding second complementary engaging means, whilst releasing the corresponding third complementary engaging means from engagement therewith, thus creating a hinge effect during swiveling of the hood, while at the location of the other of said first and second pivot means, the corresponding first engaging means releases both the corresponding second and third complementary engaging means from being engaged therewith, so that the hood can be there distanced from the bodyshell, by swiveling around said created hinge, and wherein control means are provided to bring the second and third complementary engaging means across the displacement track of the corresponding first engaging means, along an engagement direction transversal to said reversible locking direction.

15. The vehicle set forth in claim 14, wherein:

the first engaging means is swivelly mounted relative to the corresponding body, and at least some of the second and first contact surfaces respectively belong to a backup support of the first assembly element and to the first engaging means, said first engaging means being adapted for gripping with said backup support so as to:

lean against it, during locking, while the first assembly element has not yet reached its locked position, along said engagement direction, and accompany a final portion of the swivel movement of said first assembly element, and thus that of the hood, down to said locked position.

16. The vehicle set forth in claim 14, wherein said hinge means of said first and second pivot means comprises at least one arm articulated on one side in relation to the hood and on an other side in relation to the base, the corresponding third complementary engaging means is located on said at least one arm.

17. The convertible vehicle of claim 14, wherein:

the third complementary engaging means has a third contact surface for engagement with said first contact surface, and at least one of the first, second and third contact surfaces has an initial pressure zone where, during locking, the contact is initiated between said first contact surface and the second and third contact surfaces, the initial pressure zone being angulated relative to said reversible locking direction of the corresponding first engaging means and being interposed on the displacement track of said first engaging means, so that said first engaging means displaces the corresponding second and third complementary engaging means along said engagement direction, by applying a pressure that initially increases, as the contact between said first contact surface and at least one of said second and third contact surfaces develops, before said pressure becomes and remains substantially constant, while said second and third complementary engaging means substantially stop moving along said engagement direction.

18. The convertible vehicle of claim 14, wherein said first contact surface is curved along said reversible locking direction.

19. The vehicle set forth in claim 14, wherein the respective first, second and third contact surfaces are so designed that while said first contact surface is engaging said second and third contact surfaces, along at least a major portion of the movement of the first engaging means on said displacement track, said first engaging means is applying a essentially constant pressure on the corresponding second and third complementary engaging means.

20. The vehicle set forth in claim 14, wherein:

the first and second pivot means comprise respectively a front set of pivots adapted to swivel the hood from the rear to the front and a rear set of pivots, located nearer the rear of the boot and the hood than the front set of pivots and adapted to swivel said hood from the front towards the rear the first engaging means comprise hooks, the front set of pivots is located at the front of the boot and the hood and the rear set of pivots is located at the rear of the boot and the hood;

and, at the front, the hooks are open towards the front and, at the rear, the hooks are open towards the rear.

* * * * *